United States Patent [19]
Kamatani et al.

[11] Patent Number: 5,620,405
[45] Date of Patent: Apr. 15, 1997

[54] SUPPLYING METHOD AND SYSTEM OF COMPONENT/TOOL AND, APPARATUS AND CASSETTE TO BE USED IN THE METHOD

[75] Inventors: Ryoichi Kamatani, Hirakata; Hideto Machida, Moriguchi; Yoshiyuki Kubota, Katano, all of Japan

[73] Assignee: Matsushita Electric Industrial Co., Ltd., Osaka-fu, Japan

[21] Appl. No.: 267,393

[22] Filed: Jun. 29, 1994

[51] Int. Cl.⁶ .................................................. B23Q 3/155
[52] U.S. Cl. ................................................ 483/1; 483/15
[58] Field of Search .................... 483/14, 15, 1; 29/740, 741, 737; 211/1.52, 1.55

[56] References Cited

U.S. PATENT DOCUMENTS

| | | | |
|---|---|---|---|
| 4,620,754 | 11/1986 | Lycke et al. | 483/1 X |
| 4,670,976 | 6/1987 | Stridsberg et al. | 29/740 |
| 4,819,229 | 4/1989 | Yamamoto et al. | 29/740 X |
| 4,819,699 | 4/1989 | Brown et al. | 29/741 X |
| 4,917,568 | 4/1990 | Hawkswell | 414/737 |
| 5,242,359 | 9/1993 | Obrist | 211/1.52 X |
| 5,281,194 | 1/1994 | Schneider | 211/1.52 |
| 5,310,396 | 5/1994 | Momoi et al. | 483/15 |
| 5,374,231 | 12/1994 | Obrist | 211/1.55 |

FOREIGN PATENT DOCUMENTS

| | | | |
|---|---|---|---|
| 172436 | 9/1985 | Japan | 483/1 |
| 86599 | 3/1989 | Japan | 29/741 |

Primary Examiner—William R. Briggs
Attorney, Agent, or Firm—Wenderoth, Lind & Ponack

[57] ABSTRACT

Various component supplying cassettes contain components of different kinds and feed predetermined numbers of the components to take-out openings of the cassettes. A tool supplying cassette contains several kinds of tools for use with the components or for use in assembling the components and selectively feeds the tools to a take-out opening of the cassette. The component and tool supplying cassettes are set in or removed from a component/tool supplying unit of an apparatus using the components and tools in accordance with operating procedures of the apparatus and the quantity of consumption of components, thereby allowing supply of necessary components and tools to the apparatus for every necessary occasion.

14 Claims, 9 Drawing Sheets

SUPPLYING METHOD AND SYSTEM OF COMPONENT/TOOL AND, APPARATUS AND CASSETTE TO BE USED IN THE METHOD

BACKGROUND OF THE INVENTION

The present invention relates to a method and system for supplying components and tools, e.g., for an automatic component/tool feeding system of an assembling apparatus, and to an apparatus and cassettes to be used in the method.

Conventionally, apparatuses for supplying components to an assembly line in a plant or factory and also tools using the components or used in assembling the components have corresponded in shape and size with the components and tools. Among them, tray feeders, component feeders, supplying devices of taping components, etc. are representative, and many kinds of these supplying apparatuses, including special ones conforming to the components and tools, are controlled and driven respectively by people assigned exclusively for the work.

In the conventional driving state noted above, such disadvantages as will be described hereinbelow are yet to be solved.

(1) Many special apparatuses are needed for specific components and tools, and not only the constitution of the apparatuses, but the operating procedures of the apparatuses are different from each other. Therefore, it is difficult to manage and maintain each apparatus, which becomes a hindrance to the operation thereof.

(2) In the recent trend toward manufacture a plurality of kinds of products, each in a small quantity, it is hard to switch and automatically exchange the types of the apparatuses corresponding to the kinds of the products.

(3) The positional regulating accuracy of components and tools is different among the apparatuses, causing a decrease in the working efficiency.

SUMMARY OF THE INVENTION

Therefore, an object of the present invention is to provide a supplying method and system of components/tools, as well as an apparatus and cassette to be used in the method capable of simply handling and controlling various kinds of components and/or tools per cassette.

In accomplishing these and other objects, according to a first aspect of the present invention, there is provided a supplying method for supplying components and tools, whereby component supplying cassettes containing components of different kinds and feeding predetermined numbers of the components to take-out openings of the cassettes, and a tool supplying cassette containing several kinds of tools for use with the components or for use in assembling the components and selectively feeding the tools to a take-out opening of the cassette are set in or removed from a component/tool supplying unit of an apparatus using the components and tools in accordance with operating procedures of the apparatus and the amount of consumption (or use) of components, thereby enabling a proper supply of necessary components and tools to the apparatus for every necessary occasion.

According to a second aspect of the present invention, there is provided a component/tool supplying apparatus comprising:

a cassette exchanging unit located in front of a component/tool supplying unit of an apparatus which uses components and tools, the cassette exchanging unit having a plurality of cassette receptacles with traversing transfer conveyors arranged adjacent to each other; and a driving device for moving the receptacles to be selectively aligned with routes of cassette receptacles of the component/tool supplying unit.

According to a third aspect of the present invention, there is provided a first component supplying cassette for supplying one kind of component and which is used concurrently with or exchanged with a component supplying cassette containing another kind of component or a tool supplying cassette. The first cassette comprises an outer casing equal in configuration and dimensions to the second component supplying cassette or the tool supplying cassette. The first cassette has a component take-out opening at the same face of the outer casing as that of an outer casing of the second component supplying cassette or the tool supplying cassette.

According to a fourth aspect of the present invention, there is provided a tool supplying cassette which is used concurrently with or exchanged with a component supplying cassette containing components. The tool supplying cassette has an outer casing equal in configuration and dimensions to that of the component supplying cassette and a tool take-out opening at the same face of the outer casing as a component take-out opening of an outer casing of the component supplying cassette.

According to a fifth aspect of the present invention, there is provided a component/tool supplying system comprising:

a first component supplying cassette which has a first outer casing containing first components, a first take-out opening being provided at a face of the first outer casing for removing the first components from the first outer casing; and a tool supplying cassette which has an outer casing containing tools, a take-out opening is provided in this outer casing, in the face thereof corresponding to the face of the first outer casing having the first take-out opening, for removing the tools from this outer casing, this outer casing being equal in configuration and dimensions to the first outer casing, whereby the first component supplying cassette and the tool supplying cassette are used concurrently or are exchanged with each other.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
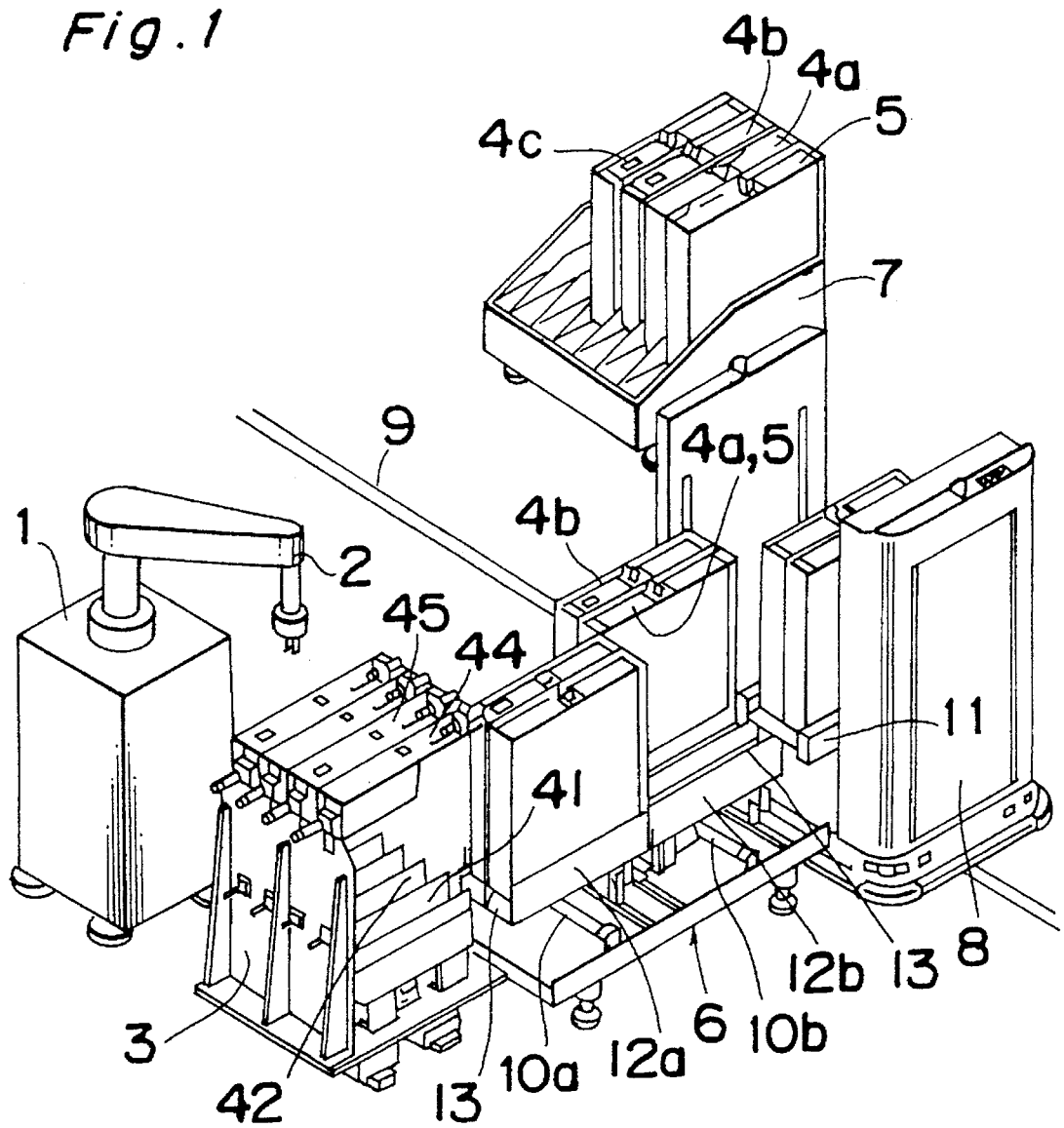
FIG. 1 is a schematic diagram of an exchanging system for exchanging component/tool supplying cassettes in accordance with a preferred embodiment of the present invention.

Before the description of the present invention proceeds, it is to be noted that like parts are designated by like reference numerals throughout the accompanying drawings.

Preferred embodiments of the present invention will be discussed hereinbelow with reference to the accompanying drawings.

Figure 3:
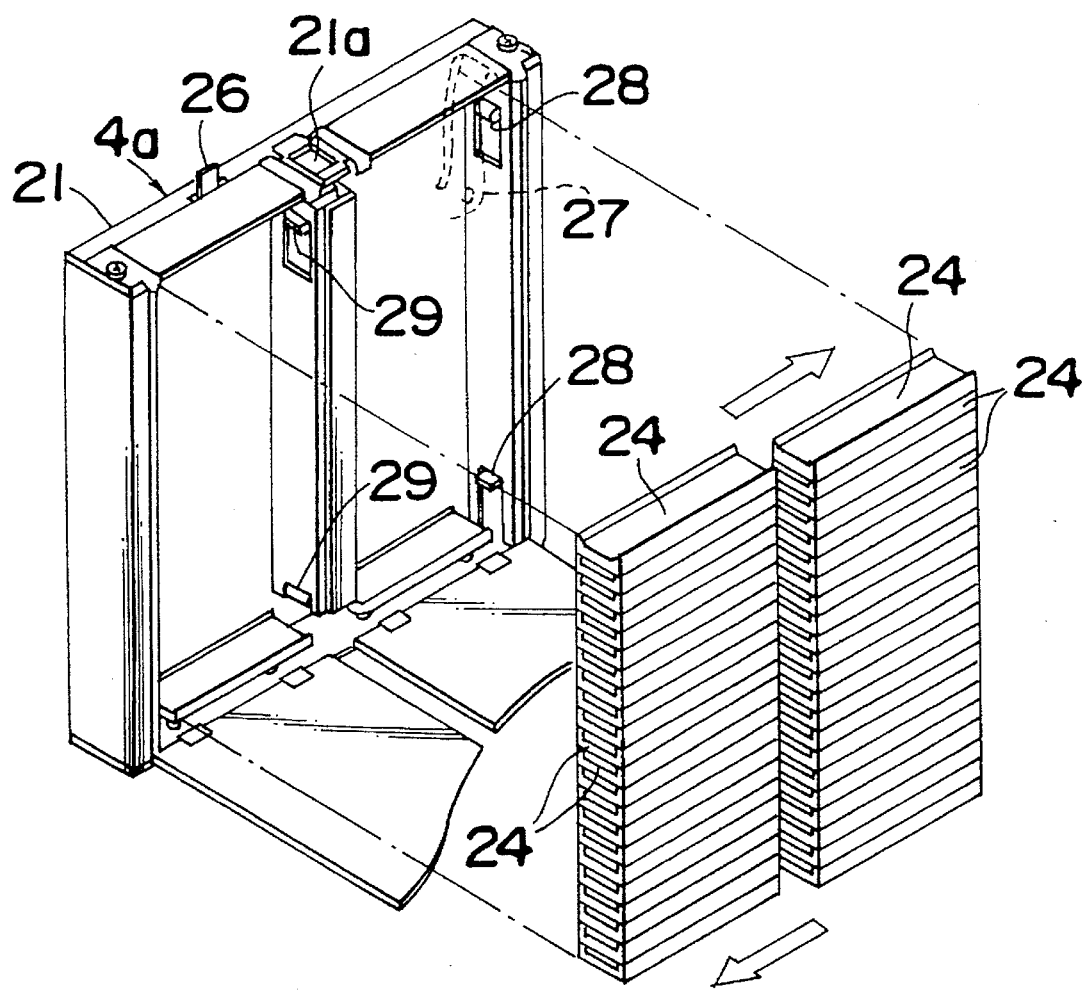
FIG. 3 is a schematic diagram of a component supplying cassette in which components are stored in pallets separately in the system.
Figure 4:
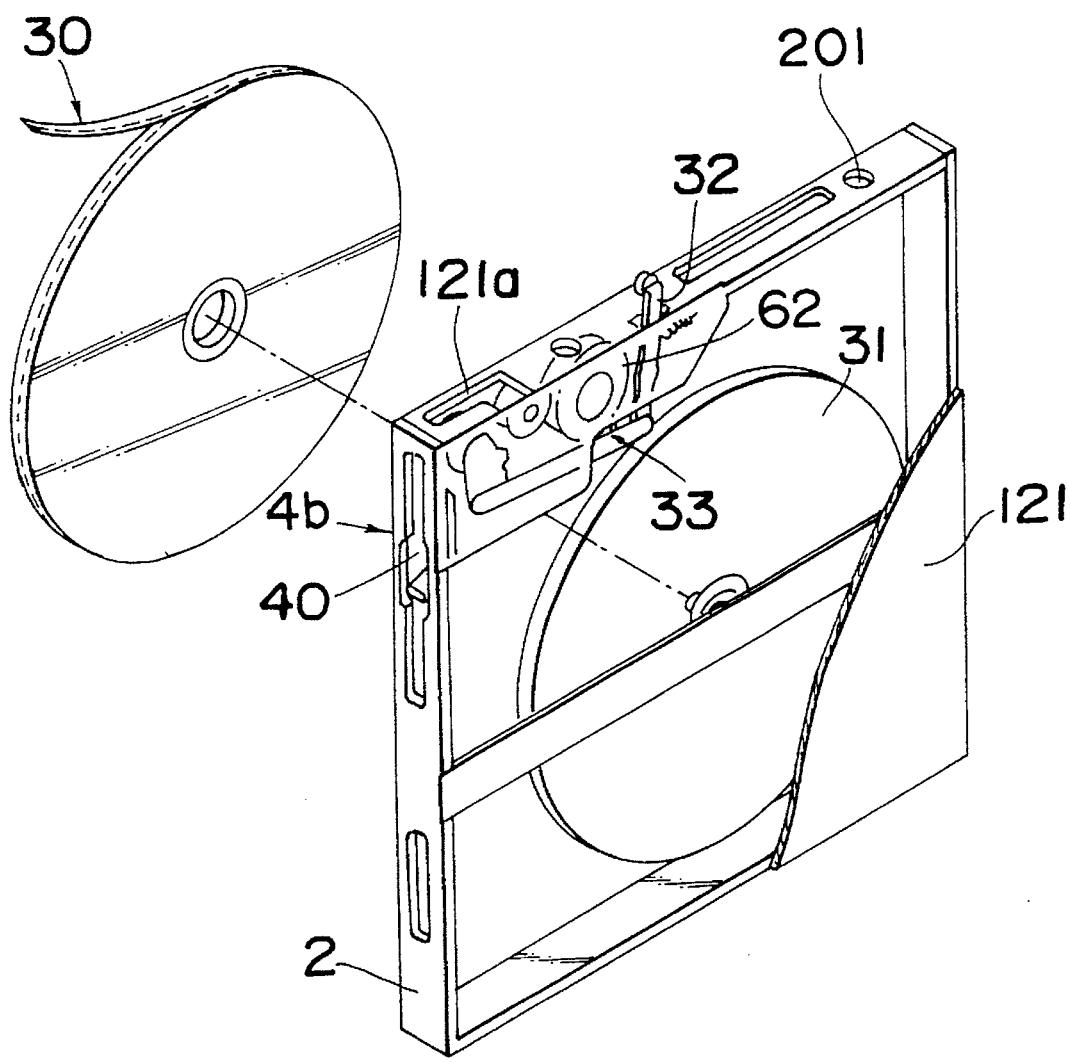
FIG. 4 is a schematic diagram of a taping component supplying cassette in the system.
Figure 5:
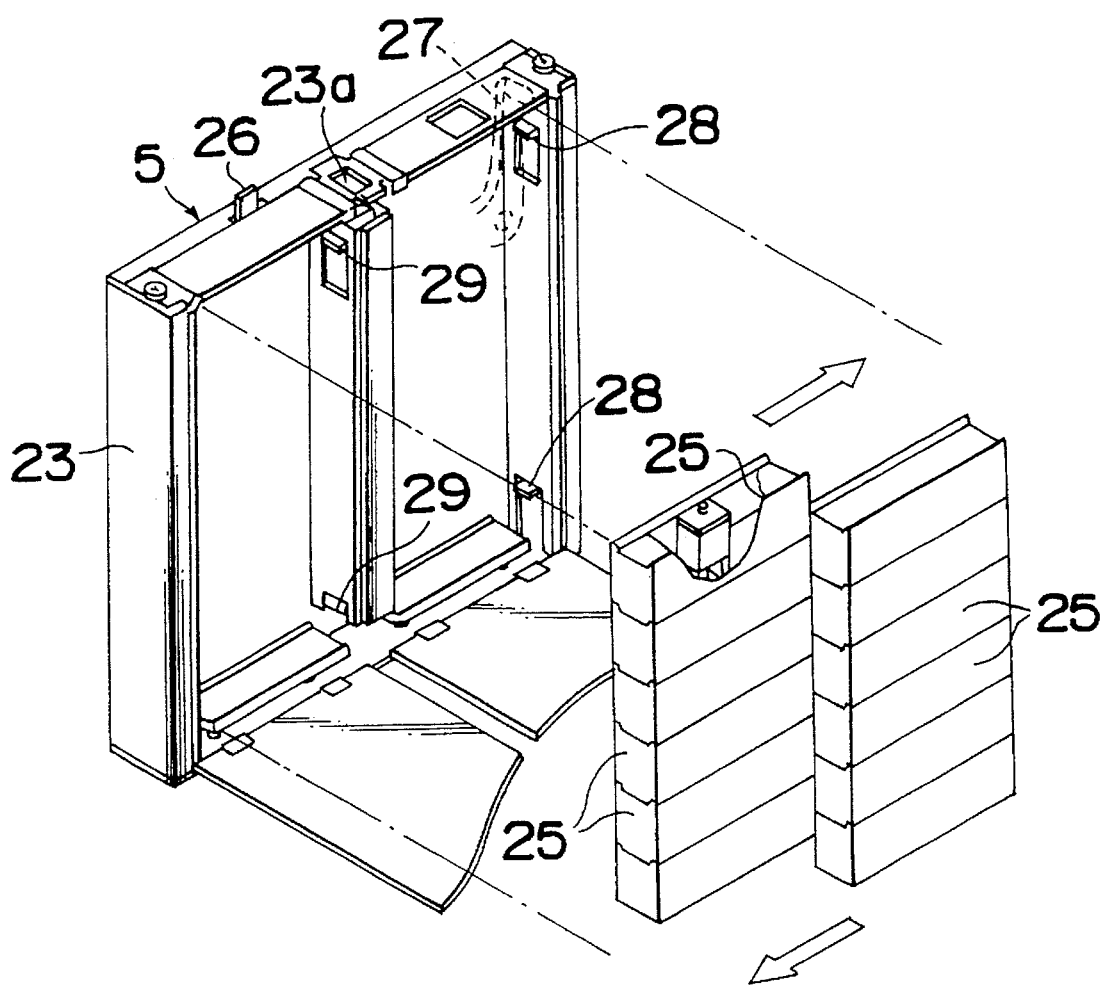
FIG. 5 is a schematic diagram of a tool supplying cassette in the system.

FIG. 1 indicates a component supplying apparatus in an embodiment of the present invention. In FIG. 1, an assembling apparatus 1 has a robot 2 to assemble products with the use of the supplied components and tools. In a cassette positioning unit 3, which functions as a component/tool supplying unit of the assembling apparatus 1, are stored component supplying cassettes 4a, 4b, 4c containing various kinds of components as shown in FIGS. 3 and 4 and a tool supplying cassette 5 containing various kinds of tools as shown in FIG. 5. The components and tools stored in the cassettes 4a, 4b, 4c, 5 are supplied to the assembling apparatus 1 by the positioning unit 3.

A cassette exchanging unit 6 is placed in front of the cassette positioning unit 3 to exchange used cassettes 4a, 4b, 4c, 5 with unused ones or change the kind of components and tools accommodated in the cassettes 4a, 4b, 4c, 5 through the cassette positioning unit 3. That is, the cassettes 4a, 4b, 4c, 5 are transferred between the cassette exchanging unit 6 and the cassette positioning unit 3.

A cassette stocker 7 is used exclusively for the assembling apparatus 1 or shared among some assembling apparatuses 1. The cassettes 4a, 4b, 4c, 5 are transferred between this cassette stocker 7 and the cassette exchanging unit 6 via a remote-controlled floor transfer device 8 so as to replace used cassettes with unused cassettes or change the kind of components or tools.

A guide line 9 in FIG. 1 guides the floor transfer device 8 for running on a floor.

The supplement of unused cassettes to the cassette stocker 7 and the recovery of used cassettes from the cassette stocker 7 are carried out by a ceiling transfer device (not shown) or the floor transfer device 8 to a store house.

The floor transfer device 8 is provided with a conveyor 11 for the transfer of cassettes between the cassette stocker 7 and the cassette exchanging unit 6. The conveyor 11 is so set as to traverse the floor transfer device 8.

The cassette exchanging unit 6 has exchange cassette receptacles 12a and standby cassette receptacles 12b at the front and rear sides thereof. More specifically, a pair of exchange cassette receptacles 12a respectively for the cassettes 4a, 5 and the cassettes 4b, 4c are arranged adjacent to each other, and two pairs of standby cassette receptacles 12b, each pair having a pair of neighboring standby cassette receptacles for the cassettes 4a, 5 and for the cassettes 4b, 4c are provided in parallel. Each cassette receptacle 12a, 12b has a conveyor 13 installed to transfer the cassettes to the floor transfer device 8 and the positioning unit 3. The conveyor 13 traverses the cassette receptacle.

In the meantime, in order to feed and receive and position the cassettes at the positioning unit 3, there are provided two pairs of receptacles each comprising a cassette receptacle 41 for receiving the cassettes 4a, 5 and a cassette receptacle 42 for receiving the cassettes 4b, 4c. The pairs are disposed adjacent to each other.

Each exchange cassette receptacle 12a and each standby cassette receptacle 12b are moved in a direction perpendicular to the transfer direction of the conveyor 13, namely, in the widthwise direction by cylinders 10a, 10b coupled to the cassette receptacles 12a, 12b.

Accordingly, a pair of the adjacent exchange cassette receptacles 12a are moved by the conveyor 13 to a position selectively agreed with the transfer route of either of the cassette receptacles 41 and 42 in the cassette positioning unit 3. The used cassettes are exchanged with unused cassettes between the cassette receptacles 12a and the cassette receptacles 41, 42.

At the same time, each pair of the standby cassette receptacles 12b are moved by the conveyor 13 to a position selectively coincident with the transfer course of the exchange cassette receptacles 12a, so that the used cassettes are replaced with unused cassettes between the agreed cassette receptacles 12a and 12b.

Naturally, the exchange cassette receptacle 12a may be omitted, and the cassettes 4a, 4b, 4c, 5 may be transferred between the standby cassette receptacle 12b and the cassette positioning unit 3.

As shown in FIGS. 3–5 and 8–10, component supplying cassettes 4a, 4b, 4c, 5 have outer casings 21, 121, 122, 23 of the same configuration and dimensions as a flat square. These cassettes 4a, 4b, 5 can be used in common in the above-described manner of transfer. The component and tool supplying cassettes 4a and 5 in FIGS. 3 and 5 also have take-out (or removal) openings 21a and 23a at the central part of the respective top faces to respectively remove the components and tools therethrough. Similarly, each of the component supplying cassettes 4b, 4c in FIGS. 4, 8, and 9 has a take-out opening 121a, 122a formed at one end of the top face thereof to remove the components therethrough.

In the component supplying cassette 4a and tool supplying cassette 5, rectangular parallelopiped component pallets 24 and rectangular parallelopiped tool pallets 25 storing many components and tools therein are circulated inside the outer casings 21, 23. While the pallets 24, 25 are moved in the horizontal direction one by one below the top face during the circulating motion, the components or tools in the pallets 24, 25 are sequentially sent to immediately below the take-out opening 21a, 23a to be picked up by the robot 2. In other words, many components and tools accommodated in the pallets 24, 25 can be supplied one by one. Every time a receiving element 26 is depressed, the components and tools pallets 24, 25 are sent in the horizontal direction from each uppermost one of the left side to the right side, and consequently, each lowest one of the right side is moved to the left side.

When a step feed lever 27 is depressed after the horizontal feeding of the pallets 24, 25 is complete, the pallets 24, 25 at the right side are lowered one step as right and left engaging hooks 28, 29 interlocking with the step feed lever 27 move up and down. At the same time, the pallets 24, 25 at the left side are raised one step. The pallets 24, 25 are thus circulated and moved in the horizontal direction and stepwise in the arrangement as described hereinabove.

One or a suitable number of and various kinds of tools are accommodated in each tool pallet 25 of the cassette 5, and the tool of a required type is positioned below the take-out opening 23a by the circulating movement of the pallets 25. Since the tools are often not expendables, it is appropriate to return the tools to predetermined pallets 25 through the take-out opening 23a after being used. The tool supplying cassette 5 may be exchanged with the other tool supplying cassette when it does not contain the required tools. Moreover, if it is unnecessary to feed tools, the tool supplying cassette 5 may be changed with the component supplying cassette 4a, 4b, or 4c to increase the kind of components to be supplied.

Figure 7:
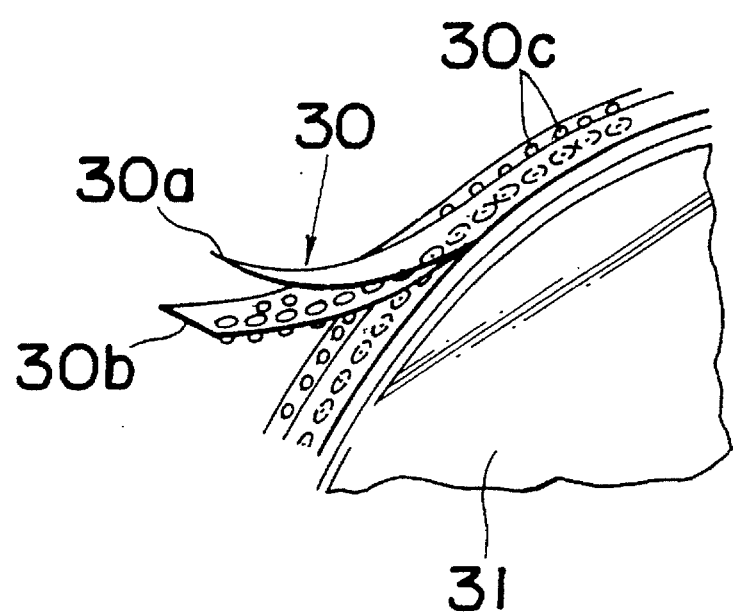
FIG. 7 is a perspective view of a taping component built in the cassette of FIG. 4.

Referring to FIG. 4, the component supplying cassette 4b accommodates a taping component 30 in the state wound around a reel 31, the taping component 30 being formed of many components removably held between a top tape 30a and a bottom tape 30b as shown in FIG. 7. A lever-rachet mechanism 33 interlocking with a receiving element 32 unwinds the taping component 30 from the reel 31 a predetermined distance each time the receiving element 32 is pressed. At this time, when the top tape 30a of the taping component 30 is separated from the bottom tape 30b, components housed within the bottom tape 30b are exposed and positioned one by one below the take-out opening 121a. The robot 2 picks up the components. Although the used bottom tape is discharged out from a window 40, the top tape is wound back to a reel 62 in the component supplying cassette 4b.

The position of the take-out openings 21a, 23a of the cassettes 4a, 5 at the top faces of the outer casings 21, 23 is different from that of the take-out opening 121a, 122a of the cassette 4b, 4c. However, since all the take-out openings are opened at the top faces of the respective casings, the picking-up direction of components and tools by the robot 2 is rendered uniform, therefore making it possible for the robot 2 to take suitable actions for the various cassettes simply by changing the picking-up position on the same plane in one direction, i.e., in one dimension.

Figure 2:
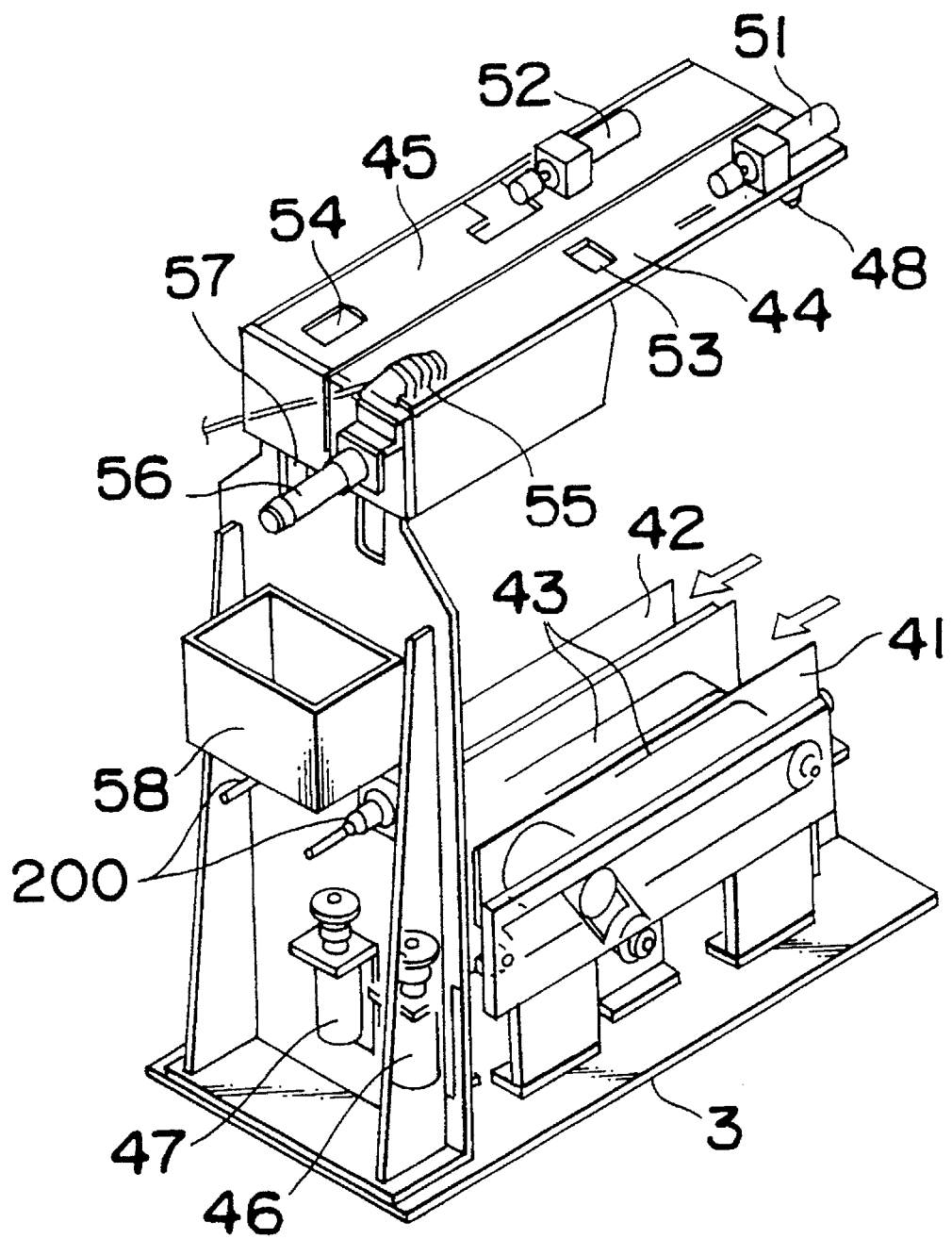
FIG. 2 is a schematic diagram of a positioning unit for positioning cassettes in accordance with the embodiment of the present invention.

As is clearly shown in FIG. 2, the cassette positioning unit 3 has two pairs of the cassette receptacles 41 and 42 aligned parallel to each other. The cassette receptacle 41 positions the component and tool supplying cassettes 4a, 5 to a supplying position with the taking-out openings 21a, 23a at the central parts of their top faces. The cassette receptacle 42 adjacent to the receptacle 41 receives and positions the component supplying cassettes 4b, 4c to a supplying position with the taking-out openings 121a, 122a at the forward ends of their top faces.

Each cassette receptacle 41, 42 has a conveyor 43 to feed the cassettes 4a, 4b, 4c, 5 to and receive them from the cassette exchanging unit 6, concretely, the exchange cassette receptacles 12a of the cassette exchange unit 6. When the supplying cassettes 4a, 4b, 4c, 5 are received at predetermined positions of the receptacles 41, 42 as detected by position detecting sensors 200, the cassettes are raised together with the receptacles 41, 42, and pressed and positioned against cassette positioning plates 44, 45 above the receptacles 41, 42 by lift cylinders 46, 47 by engaging positioning pins 48 into holes 201 of the supplying cassettes. The positioning of the cassette receptacles 41, 42 is relieved when the receptacles 41, 42 are descended by the cylinders 46, 47, whereby the cassettes 4a, 4b, 4c, 5 on the cassette receptacles 41, 42 can be removed to the cassette exchanging unit 6.

The cassette positioning plates 44, 45 have the cassette positioning pins 48, cylinders 51, 52 for pressing the receiving elements 26, 32 of the cassettes 4a, 4b, 4c, 5 to feed the taping component 30, etc. pitch by pitch (i.e. by predetermined distances), and take-out windows 53, 54 opposite to the take-out openings 21a, 121a, 122a, 23a. Moreover, the positioning plate 44 has a connecting terminal section 55 for the connection of the operating air, electricity, and signal lines, etc. to the cassettes 4a, 4b, 4c, 5 and an operating cylinder 56 for pressing the step feed lever 27 for the stepwise feed. An opening 57 of the cassette positioning unit 3 faces the window 40 of the feeding cassette 4b, through which the used bottom tape 30b sent out from the window 40 is discharged outside. The bottom tape 30b sent outside is cut by a cutting mechanism 61 (FIG. 8) and stored in a tape receiver 58 at the front face of the cassette positioning unit 3.

The above component and tool supplying cassettes 4a, 4b, 4c, 5 are exchanged in a manner as will be described in detail below.

While the cassette 4a or 5 is fixed to the positioning plate 44, the cassette 4b or 4c is fixed to the positioning plate 45, and components or tools are sequentially picked up by the robot 2. For instance, one of the component supplying cassettes 4a required next is sent into the vacant standby cassette receptacle 12b of the exchanging unit 6 from the cassette stocker 7 by the floor transfer device 8.

After a predetermined number or all of the components or tools in the cassette 4a, 4b, 4c or 5 fixed to the positioning plate 44 or 45 are taken out and completely used, the cassette 4a, 4b, 4c, 5 is lowered by the lift cylinder 46, 47. Then, a pair of the exchange cassette receptacles 12a of the exchanging unit 6 are moved by the cylinder 10a to a position confronting to a pair of the standby cassette receptacles 12b. The used cassette 4a, 4b, 4c, 5 is removed from the cassette receptacle 41, 42 of the positioning unit 3 and returned to the exchange cassette receptacle 12a.

The used component, tool supplying cassette 4a, 4b, 4c, 5 returned to the exchange cassette receptacle 12a is sent back to the vacant standby cassette receptacle 12b confronting to the receptacle 12a.

During the above-described operation, an unused cassette 4a, 4b, 4c, 5 required next is supplied to the vacant standby cassette receptacle 12b not facing to the exchange cassette receptacle 12a from the stocker 7.

Thereafter, the standby cassette receptacle 12b accommodating the unused cassette 4a, 4b, 4c, 5 is moved in the widthwise direction by the cylinder 10b to confront to the exchange cassette receptacle 12a from which the used cassette 4a, 4b, 4c, 5 has been already removed at the cassette positioning unit 3.

The unused cassette 4a, 4b, 4c, 5 accommodated in the standby cassette receptacle 12b is set in the cassette receptacle 41, 42 of the positioning unit 3 through the exchange cassette receptacle 12a of the exchanging unit 6. The unused components or tools in the cassette are supplied in the previously described manner.

Meanwhile, the used cassette 4a, 4b, 4c, 5 returned to the standby cassette receptacle 12b is brought back to the stocker 7 by the floor transfer device 8.

Although the cassettes 4b, 4c have outer casings 121, 122 of the same configuration and dimensions as described earlier, the used tapes of the taping component 30 contained in the cassettes 4b, 4c shown in FIG. 7 can be treated in different manners.

Figure 8:
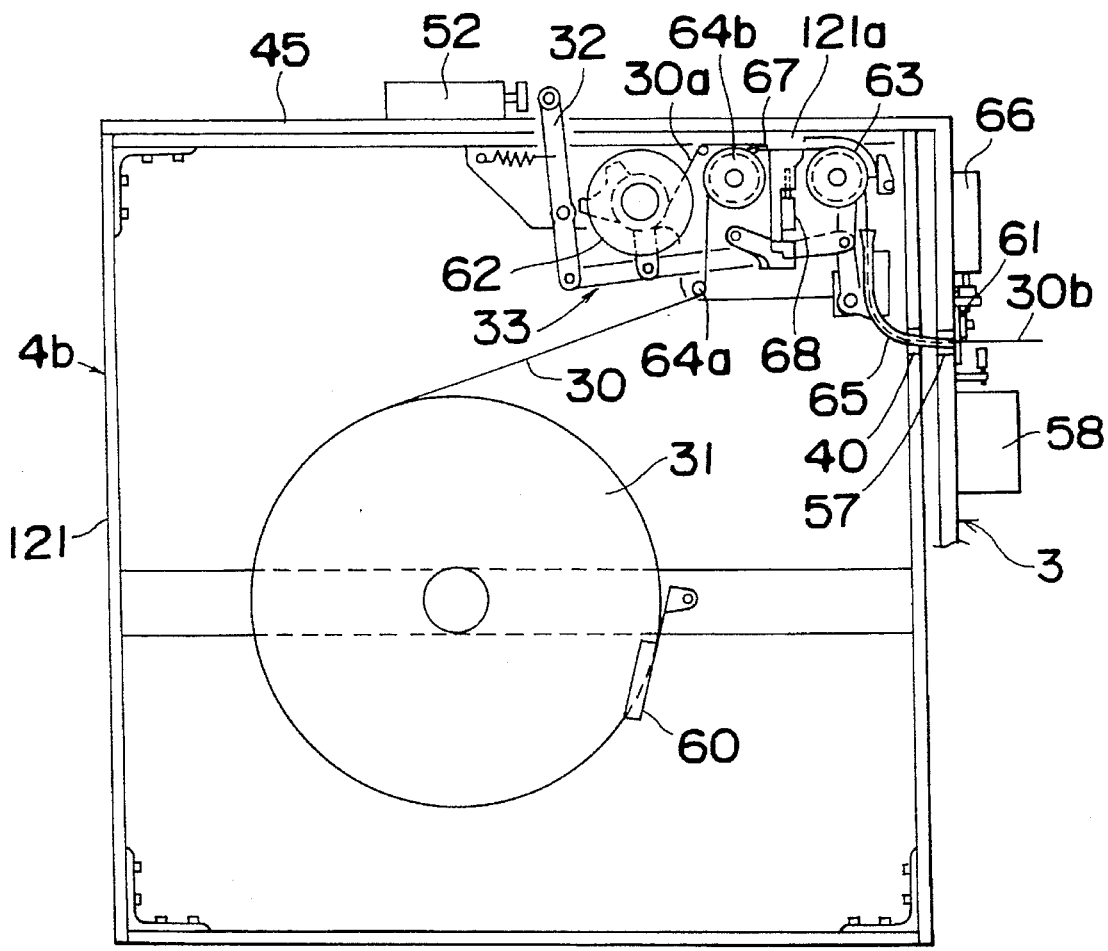
FIG. 8 is a diagram showing the internal structure of the cassette of FIG. 4.

The taping component supplying cassette 4b in FIGS. 4, 8 is fit for taping components using to-be-dumped paper tapes or embossed tapes as the bottom tape 30b which is cut up.

Figure 9:
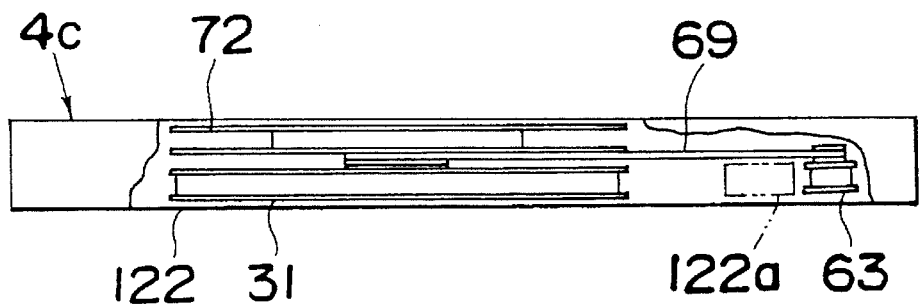
FIGS. 9 and 10 are a plan view and a diagram showing the internal structure of another taping component supplying cassette in the system.
Figure 10:
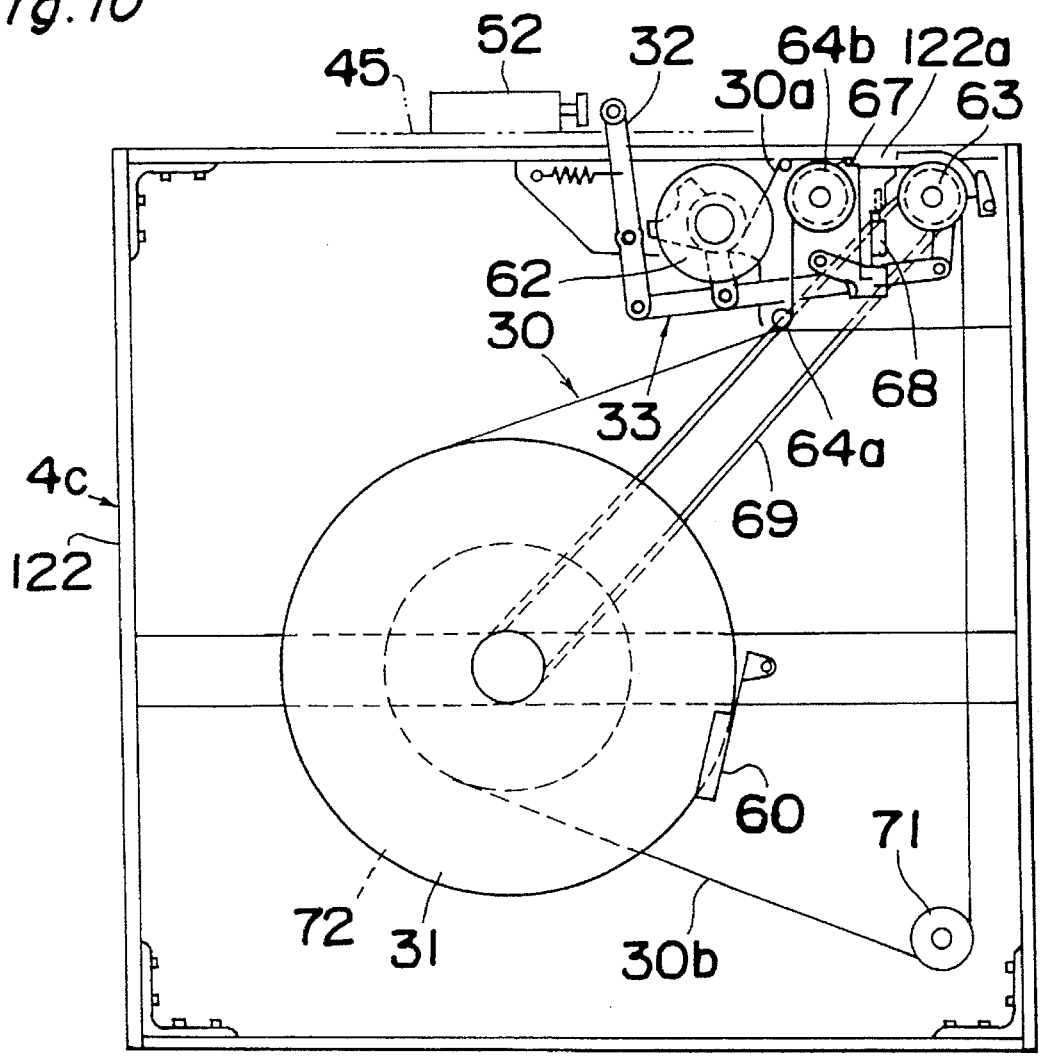

In the meantime, the cassette 4c in FIGS. 9, 10 is suitably employed for taping components using, for example, molding carrier tapes as the bottom tape 30b which is re-used. The bottom tape 30b is rewound within the cassette 4c and collected together with the cassette 4c.

In order to meet the above different way of handling, the cassette 4b is provided with a top tape winding reel 62 driven by the lever/rachet mechanism 33, a bottom tape feed roller 63, and bottom tape feed intermediate guide rollers 64a, 64b as shown in FIG. 8.

The bottom tape 30b is positively sent out at predetermined distances (pitches) due to the rotation of the bottom tape feed roller 63 when perforations 30c formed at the peripheral edge of the bottom tape 30b are meshed with teeth (not shown) of the bottom tape feed roller 63. As a result, the taping component 30 wound around the reel 31 is drawn out against the resistance of a regulation spring 60, and therefore, slack in the taping component 30, due to the inadvertent or extraordinary rotation of the reel 31, is prevented.

When the used bottom tape 30b is sent out, the used bottom tape 30b having the containing components picked up at a position confronting to the take-out opening 121a is guided by a tape guide 65 to be discharged to the front side of the cassette positioning unit 3 through the window 40 and the opening 57 of the unit 3. Every time the bottom tape 30b is discharged, the cutting mechanism 61 is activated by a cylinder 66 at the front side of the positioning unit 3 to thereby cut the bottom tape 30b and cause it to be stored in the tape receiver 58.

The top tape 30a is separated from the bottom tape 30b via a guide (not shown) at a position immediately before the taping component 30 drawn out from the reel 31 confronts the take-out opening 121a. The top tape 30a is wound up around the top tape winding reel 62 in a tensioned state through a turning section 67 in an opposite direction to the feeding direction of the components. The take-up force at this time becomes the separating force of the top tape 30a from the bottom tape 30b. The rotating ratio of the winding reel 62 to the bottom tape feed roller 63 is set so that the top tape 30a is kept tensioned.

A component push-up unit 68 is provided below a position where the taping components 30 face the take-out opening 121a. The component push-up unit 68 acts in association with the lever/rachet mechanism 33 each time the taping components 30 are unwound by the predetermined distance, thereby pushing up the component in the taping component 30 facing the take-out opening 121a to a predetermined position to be properly picked up by the robot 2.

Similar to the cassette 4c indicated in FIGS. 9, 10, the cassette 4b of FIG. 8 has the wind reel 31, the lever/rachet mechanism 33, the top tape wind reel 62, the bottom tape feed roller 63, the bottom tape feed intermediate guide rollers 64a, 64b, and the component push-up unit 68. The cassette 4c is different from the cassette 4b in a point that the bottom tape 30b sent out by the bottom tape feed roller 63 is taken around a bottom tape wind reel 72 which is coaxial with the wind reel 31 via a guide roller 71 located in the front lower part of the cassette 4c. For this purpose, the rotation of the bottom tape feed roller 63 is arranged to be transmitted to the bottom tape wind reel 72 by a belt 69. Accordingly, both the used bottom tape 30b and the used top tape 30a are collected together with the cassette 4c, making it possible to use the bottom tape 30b as well as the top tape 30a again.

According to the above embodiment of the present invention, various kinds of components are stored in the corresponding supplying cassettes 4a, 4b, 4c and selectively fed to the take-out openings. Likewise, various kinds of tools are stored and selectively sent to the take-out opening from the tool supplying cassette 5. Since the component supplying cassettes 4a, 4b, 4c and tool supplying cassette 5 are fed or exchanged at the cassette positioning unit 3 in accordance with the operating procedures of the assembling apparatus 1 or the consuming state of components and tools therein, it becomes possible to feed necessary components or tools to the apparatus 1 at the necessary time. The operation in the assembling apparatus 1 is ensured merely by the easy handling and management of components and tools per cassette.

Moreover, since the configuration and size of the cassettes 4a, 4b, 4c, 5 are made uniform, the cassettes can be inserted into and removed from the cassette receptacles 41, 42 of the positioning unit 3 in the same manner. The cassettes 4a, 4b, 4c, 5 can be handled uniformly irrespective of the kind of components or whether they contain components or tools.

The supplying cassettes 4a, 4b, 4c, 5 may have, in similar structure, the take-out openings 21a, 121a, 122a, 23a as well as the receiving elements of the operating mechanism which feed the components or tools to the take-out openings 21a, 121a, 122a, 23a. In such arrangement as this, each cassette can be treated completely uniformly.

Because of the presence of the cassette exchanging unit 6 in front of the cassette positioning unit 3, it is readily achieved to set the cassettes 4a, 4b, 4c, 5 into and remove the cassettes from the cassette receptacles 41, 42 of the unit 3 while the cassettes 4a, 4b, 4c, 5 are supported and guided in the vicinity of the unit 3. Particularly, the standby cassette receptacles 12b of the exchanging unit 6 are moved to be selectively positioned on the route of the cassette receptacles 41, 42 of the positioning unit 3 directly or via the exchange cassette receptacles 12a if the cassettes 12a are provided. Therefore, the used and unused cassettes can be smoothly exchanged without interferences therebetween regardless of the kind of cassettes 4a, 4b, 4c, 5.

In the foregoing embodiment, components and tools stored in the cassettes 4a, 5 are sequentially sent to the take-out openings 21a, 23a as the layered pallets at the right and left sides containing the components and tools are moved in the horizontal direction and stepwise by the cylinders 51, 52, 56 on the positioning plates 44, 45. However, the pallets may be moved by installing driving parts such as cylinders or the like in the cassettes 4a, 5 and controlling the driving parts from the assembling apparatus 1 via the connecting terminal section 55.

Figure 6:
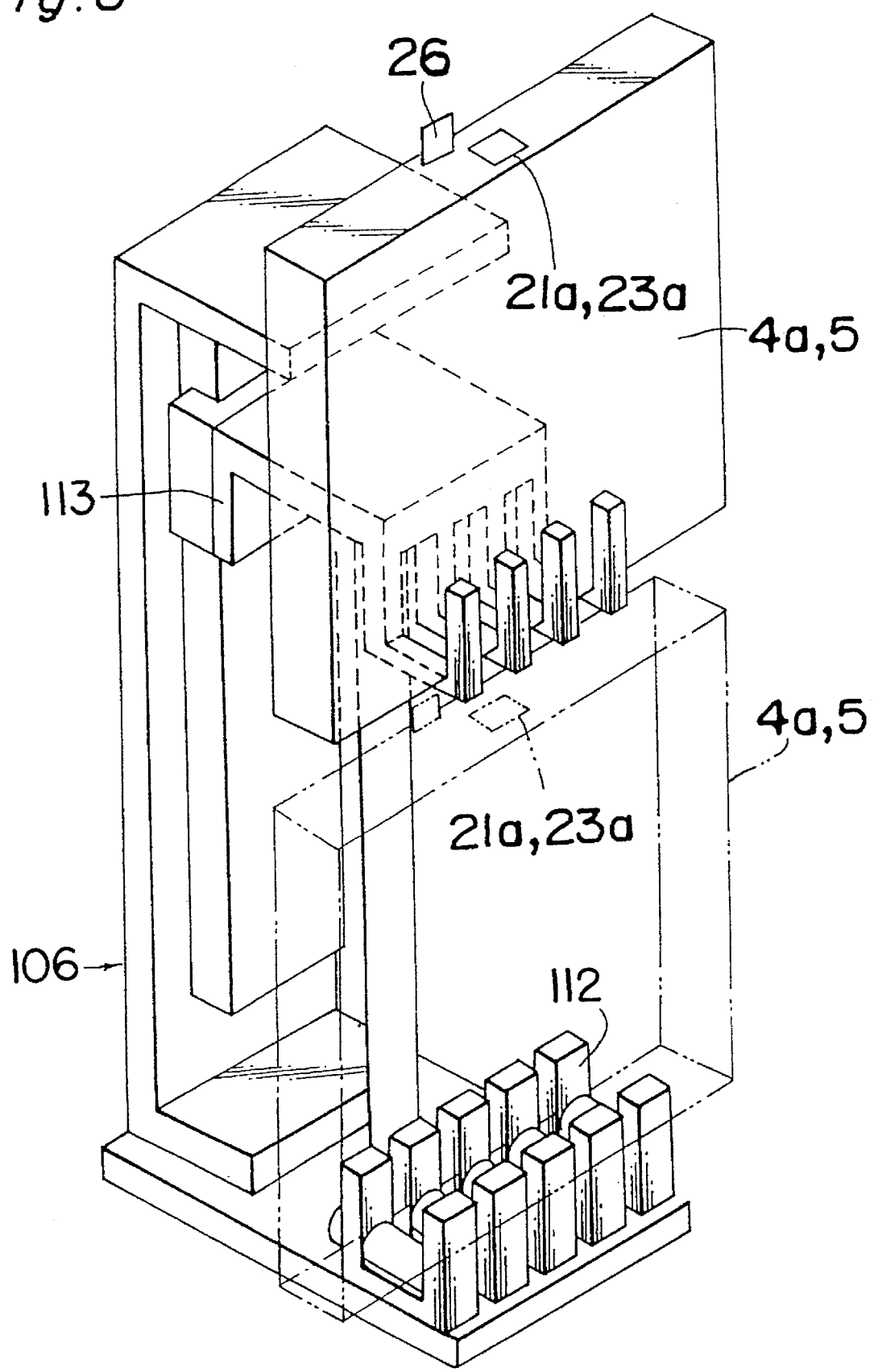
FIG. 6 is a schematic diagram of another cassette exchanging unit in the system.

FIG. 6 shows a cassette exchanging unit 106 of a different embodiment. The cassette exchanging unit 106 feeds and receives the cassettes 4a, 4b, 4c, 5 by a roller-type cassette receptacle 112, and moves the cassettes 4a, 4b, 4c, 5 up and down by a cylinder-type lifter 63. When the cassettes 4a, 4b, 4c, 5 are lifted from the cassette receptacle 112, the cassettes are kept on standby, so that the other cassettes can be received at the cassette receptacle 112.

According to the supplying method of the embodiments, the component supplying cassettes for the various kinds of components and the tool supplying cassette containing tools used in assembling the components are used in the mixed state. The cassettes are set or exchanged in accordance with the operating procedures of the apparatus and consuming state of components, whereby, through this simple handling and management of component, and tools per cassette, the operation of the apparatus is ensured as required. In consequence, various kinds of components and tools can be handled and controlled simply and automatically, and the supplying apparatus becomes compact and cost-saving with a simple structure.

When the configuration and dimensions of the cassettes are made uniform for the various kinds of cassettes, the cassettes can be handled in the same fashion regardless of the kind of components or the difference between the components and tools. In other words, handling of components and tools becomes furthermore easy and fit for automation, and the apparatus handling the components and tools is simplified and results in cost-saving.

According to the supplying apparatus of components and tools of the embodiments, the cassette exchanging unit supports and guides the supplying cassettes in the vicinity of the component/tool supplying unit of the apparatus. Therefore, the cassettes can be supplied or removed easily and positively. When a plurality of cassette receptacles with transfer conveyors arranged adjacent to each other in the cassette exchanging unit are moved in the widthwise direction, the used and unused cassettes can be smoothly exchanged with no interference therebetween, thus reducing the loss of time for the exchange of cassettes and enabling a high-speed operation.

Since take-out openings are opened at the same faces of outer casings of the cassettes of the same configuration and dimensions, the components and tools can be supplied in the same direction, thereby simplifying the control of the transfer (feed and receipt) of components and tools to the apparatus.

According to the embodiment of the present invention, the one taping component supplying cassette is made uniform in the configuration and dimensions relative to the other taping component supplying cassette, and handled in the same fashion. In other words, the one taping component supplying cassette is rendered compatible with the other supplying cassette irrespective of the difference of the handling methods for handling used tapes. Therefore, the cassette of the embodiment is convenient to handle and fit for automation.

Since it is easy to exchange the cassettes of various kinds whenever it is required, the number of taping component supplying cassettes in a set, e.g., in an assembly apparatus, is greatly reduced, so that the apparatus is compact and results in cost-saving.

Moreover, in the component supplying cassettes according to the various embodiments of the invention, the used bottom tapes may be treated in different ways, i.e., to be cut and dumped or, collected and re-used, regardless of the handling compatibility. Therefore, the taping component supplying cassettes of the embodiments are convenient to feed two kinds of taping components having the used bottom tapes handled in different manners.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A method of supplying different kinds of components and tools, comprising the steps of:

providing a component/tool supplying apparatus comprising a component/tool supplying unit; plural component supplying cassettes respectively having component take-out openings, respectively containing different kinds of components, and for respectively feeding the components contained therein to the component take-out openings; and a tool supplying cassette having a tool take-out opening, containing tools for use with the components or for use in assembling the components, and for feeding the tools to the tool take-out opening; wherein the plural component supplying cassettes and the tool supplying cassette are of uniform dimensions;

setting at least one of the component supplying cassettes and the tool supplying cassette in the component/tool supplying unit in accordance with consumption of the components and operating procedures of the component/tool supplying apparatus; and exchanging at least one other of the component supplying cassettes and the tool supplying cassette for said at least one of the component supplying cassettes and the tool supplying cassette set in the component/tool supplying unit in said setting step, in accordance with the consumption of the components and the operating procedures of the component/tool supplying apparatus so that the different kinds of components and tools are available in the component/tool supplying unit when required.

2. A method as recited in claim 1, wherein said step of providing the component/tool supplying apparatus comprises providing the plural component supplying cassettes and the tool supplying cassette with uniform configurations.

3. A method as recited in claim 1, wherein said step of providing the component/tool supplying apparatus comprises providing the component/tool supplying unit with plural cassette receptacles for receiving the component supplying cassettes and the tool supplying cassette.

4. A method as recited in claim 3, wherein said step of providing the component/tool supplying apparatus comprises further providing a cassette exchanging unit including plural cassette receptacles; and said exchanging step comprises selectively moving said plural cassette receptacles of the cassette exchanging unit into alignment with selected ones of the cassette receptacles of the component/tool supplying unit, transferring said at least one other of the component supplying cassettes and the tool supplying cassette from at least one of the cassette receptacles of the cassette exchanging unit to at least one of the cassette receptacles of the component/tool supplying unit, and transferring said at least one of the component supplying cassettes and the tool supplying cassette from at least one of the cassette receptacles of the component/tool supplying unit to at least one of the cassette receptacles of the cassette exchanging unit.

5. A method as recited in claim 4, wherein said step of providing the component/tool supplying apparatus further involves providing a cassette stocker located such that the cassette exchanging unit is disposed between the cassette stocker and the component/tool supplying unit for holding additional component and tool supplying cassettes; and in providing the cassette exchanging unit, the plural cassette receptacles provided therefor include a pair of exchange cassette receptacles at a front end of the cassette exchanging unit which is located adjacent the component/tool supplying unit, and two pair of standby cassette receptacles at a rear end of the cassette exchanging unit which is opposite the front end thereof and adjacent said cassette stocker.

6. A method as recited in claim 5, further comprising the steps of:
- transferring at least selected ones of the component and tool supplying cassettes between the standby cassette receptacles and the cassette stocker; and
- transferring at least selected ones of the component and tool supplying cassettes between the exchange cassette receptacles and the standby cassette receptacles.

7. A method as recited in claim 6, wherein
in providing the exchange cassette receptacles and the standby cassette receptacles, the standby cassette receptacles are arranged adjacent to each other, and the exchange cassette receptacles are arranged parallel to each other.

8. A method as recited in claim 1, wherein
said step of providing the component/tool supplying apparatus further involves providing a cassette stocker holding unused additional component and tool supplying cassettes; and
further comprising a step of replacing used ones of the component and tool supplying cassettes with unused ones of the component and tool supplying cassettes by transferring the used ones of the component and tool supplying cassettes from the cassette exchanging unit to the stocker, and transferring the unused ones of the component and tool supplying cassettes from the stocker to the cassette exchanging unit.

9. A method as recited in claim 1, wherein
said step of providing the component/tool supplying apparatus further comprises providing a cassette exchanging unit, said cassette exchanging unit holding first ones of the component and tool supplying cassettes which contain first kinds of components and tools, respectively, and providing a cassette stocker holding second ones of the component and tool supplying cassettes which contain second kinds of components and tools, respectively; and
further comprising a step of replacing the first ones of the component and tool supplying cassettes with the second ones of the component and tool supplying cassettes by transferring the first ones of the component and tool supplying cassettes from the cassette exchanging unit to the stocker, and transferring the second ones of the component and tool supplying cassettes from the stocker to the cassette exchanging unit.

10. A method of supplying different kinds of components and tools, comprising the steps of:
providing a component/tool supplying apparatus comprising a component/tool supplying unit; a cassette exchanging unit disposed adjacent a rear end of said component/tool supplying unit; and a plurality of uniformly dimensioned supplying cassettes respectively having take-out openings, each supplying cassette containing one of components and tools and being operable to feed said one of the components and tools contained therein to the respective take-out opening, a pair of said uniformly dimensioned supplying cassettes being held by said cassette exchanging unit; and
simultaneously transferring said pair of said uniformly dimensioned supplying cassettes forwardly from said cassette exchanging unit to said component/tool supplying unit in accordance with consumption of the components and operating procedures of the component/tool supplying apparatus.

11. A method as recited in claim 10, further comprising the step of
exchanging said pair of said uniformly dimensioned supplying cassettes for another pair of said uniformly dimensioned supplying cassettes by simultaneously transferring said pair of said uniformly dimensioned supplying cassettes rearwardly from the component/tool supplying unit to said cassette exchanging unit and simultaneously transferring said another pair of said uniformly dimensioned supplying cassettes forwardly from said cassette exchanging unit to said component/tool supplying unit, in accordance with the consumption of the components and the operating procedures of the component/tool supplying apparatus.

12. A method as recited in claim 10, wherein
said step of providing the component/tool supplying apparatus comprises providing the component/tool supplying unit with plural cassette receptacles for receiving the supplying cassettes.

13. A method as recited in claim 10, wherein
said step of providing the component/tool supplying apparatus further involves providing a cassette stocker holding unused additional supplying cassettes; and
further comprising a step of replacing used ones of the supplying cassettes with unused ones of the supplying cassettes by transferring the used ones of the supplying cassettes from the cassette exchanging unit to the stocker, and transferring the unused ones of the supplying cassettes from the stocker to the cassette exchanging unit.

14. A method as recited in claim 10, wherein
said step of providing the component/tool supplying apparatus involves providing the cassette exchanging unit with first ones of the supplying cassettes which contain first kinds of components and tools, and involves providing a cassette stocker holding second ones of the supplying cassettes which contain second kinds of components and tools; and
further comprising a step of replacing the first ones of the supplying cassettes with the second ones of the supplying cassettes by transferring the first ones of the supplying cassettes from the cassette exchanging unit to the stocker, and transferring the second ones of the supplying cassettes from the stocker to the cassette exchanging unit.

* * * * *